(12) United States Patent
Shen et al.

(10) Patent No.: US 6,242,955 B1
(45) Date of Patent: Jun. 5, 2001

(54) DELAY LOCK LOOP CIRCUIT, SYSTEM AND METHOD FOR SYNCHRONIZING A REFERENCE SIGNAL WITH AN OUTPUT SIGNAL

(75) Inventors: Fang Shen, San Jose; Chen Wang, Sunnyvale, both of CA (US)

(73) Assignee: Silicon Magic Corporation, Sunnyvale, CA (US)

( * ) Notice: Subject to any disclaimer, the term of this patent is extended or adjusted under 35 U.S.C. 154(b) by 0 days.

(21) Appl. No.: 09/399,116

(22) Filed: Sep. 20, 1999

(51) Int. Cl.[7] .................................................. H03L 7/06
(52) U.S. Cl. .............................................. 327/158; 327/284
(58) Field of Search .................................. 327/158, 157, 327/159, 277, 284

(56) References Cited

U.S. PATENT DOCUMENTS 4,847,870 * 7/1989 Butcher ................................. 375/333
5,487,093 * 1/1996 Adresen et al. ..................... 375/376

* cited by examiner

Primary Examiner—Toan Tran
Assistant Examiner—Cassandra Cox
(74) Attorney, Agent, or Firm—Sawyer Law Group LLP

(57) ABSTRACT

A method and system for synchronizing a reference signal and an output signal produced by an electrical circuit, the electrical circuit comprising an analog portion and a digital portion, is disclosed. The method comprises the steps of utilizing the digital portion to produce a phase-adjusted signal and utilizing the analog portion to produce an output signal in substantially the same phase as the phase-adjusted signal. Through the use of the method and system in accordance with the present invention, the large bi-direction shift register of conventional hybrid DLLs is no longer necessary and high speed DLLs will be capable of providing high resolution deskewed clocks in a shorter amount of time. The use of the present invention also facilitates the coverage of a wider range of clock frequencies.

17 Claims, 7 Drawing Sheets

DELAY LOCK LOOP CIRCUIT, SYSTEM AND METHOD FOR SYNCHRONIZING A REFERENCE SIGNAL WITH AN OUTPUT SIGNAL

FIELD OF INVENTION

The present invention relates to clock synchronizing circuits and more particularly, to a circuit method and system for synchronizing an output clock signal with an input reference clock signal.

BACKGROUND OF THE INVENTION

The problem of providing clock regeneration systems in semiconductor memory devices which will achieve stable lock in the shortest time, irrespective of whether the phase of a local clock signal is leading or lagging relative to the phase of a reference signal, has been a major challenge to designers in the high speed computer field. The regeneration must be performed at all sites in the computer so that all regenerated clock signals are produced with minimum skew. Current telecommunication and graphics applications such as pixel clock generation require high resolution, fast lock-in times and a wide frequency range. Furthermore, DDR DRAM circuits require the minimum phase delay time to be less than one-half period of the reference signal.

Delay Lock Loop (DLL) circuits have become a critical part in solving this electronic system timing problem. In particular, DLLs allow designers to monitor the phase difference between a reference signal and an internal clock signal, relative to the reference signal. This phase difference between the reference signal and the internal clock signal results in a corresponding response delay in the semiconductor memory device. Consequently DLLs are utilized to align the reference signal with the internal clock signal. There are three types of DLLs: digital, analog, and hybrid.

FIG. 1 shows a conventional digital delay locked loop (D-DLL) configuration. A D-DLL consists of a phase detector 12 which measures the phase difference between an input reference signal 10 and an internal timing signal. The phase detector 12 drives a shift register 14 which causes the stored data to move to the right or left one bit position based on the difference in the signals. The shift register 14 is coupled to a delay line 16 for producing a phase-adjusted clock signal 20 by sequentially delaying the internal timing signal in accordance with the shift register 14. When the reference signal 10 and the internal timing signal are identical, the DLL is "locked" onto the reference signal. A clock buffer circuit 18 simply buffers the phase-adjusted clock signal 20 prior to output.

This kind of DLL is simple to implement and will be locked-in very quickly but has several drawbacks. Resolution is not very high and the minimum phase difference will change when operation conditions (i.e. supply voltage, temperature) change. Also, a long delay line is needed to achieve a reasonable resolution and cover a wider frequency range while a large shift register is needed to control the switch inside the delay line.

FIG. 2 shows a conventional analog delay locked loop (A-DLL) configuration. This type of DLL configuration consists of a phase-frequency detector 32 which measures the phase and frequency difference between an input reference signal 30 and an internal timing signal. The phase-frequency detector 30 then supplies a phase difference detection signal, based on the phase difference between the two signals, which generates a direct control voltage to a delay line 34 through the current controller 36 which includes a charge pump and a low pass filter (LPF) 33. The delay line 34 then develops an internal timing signal that is fed back to the phase-frequency detector for comparison with the reference signal 30. Again, when the reference signal 30 and the internal timing signal are identical, the DLL is locked onto the reference signal 32. This type of DLL delivers a high resolution but consequently has a very long lock-in time.

There are ways to build hybrid DLLs which have both digital and analog delay controls. FIG. 3 shows the architecture of a conventional hybrid DLL 50 containing digital delay controls 52 and analog delay controls 54. However, conventional hybrid DLLs employ a large shift register 56 and normally exhibit phase jump problems when tracking an internal clock signal because the digital delay controls may keep shifting before the analog delay controls can respond. Also, the implementation of solid control circuits for conventional hybrid DLLs is difficult and typically these DLLs do not cover a large frequency range.

What is needed is a hybrid DLL that will provide faster lock-in times, cover a large frequency range, while also providing a high resolution. The present invention addresses such a need.

SUMMARY OF THE INVENTION

A method and system for synchronizing a reference signal and an output signal produced by an electrical circuit, the electrical circuit comprising an analog portion and a digital portion, is disclosed. The method comprises the steps of utilizing the digital portion to produce a phase-adjusted signal and utilizing the analog portion to produce an output signal in substantially the same phase as the phase-adjusted signal.

Through the use of the method and system in accordance with the present invention, the large bi-direction shift register of conventional hybrid DLLs is no longer necessary and high speed DLLs will be capable of providing high resolution deskewed clocks in a shorter amount of time. The use of the present invention also facilitates the coverage of a wider range of clock frequencies.

DETAILED DESCRIPTION OF THE INVENTION

The present invention provides a method and system for synchronizing a reference signal with an output signal. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

Figure 1:
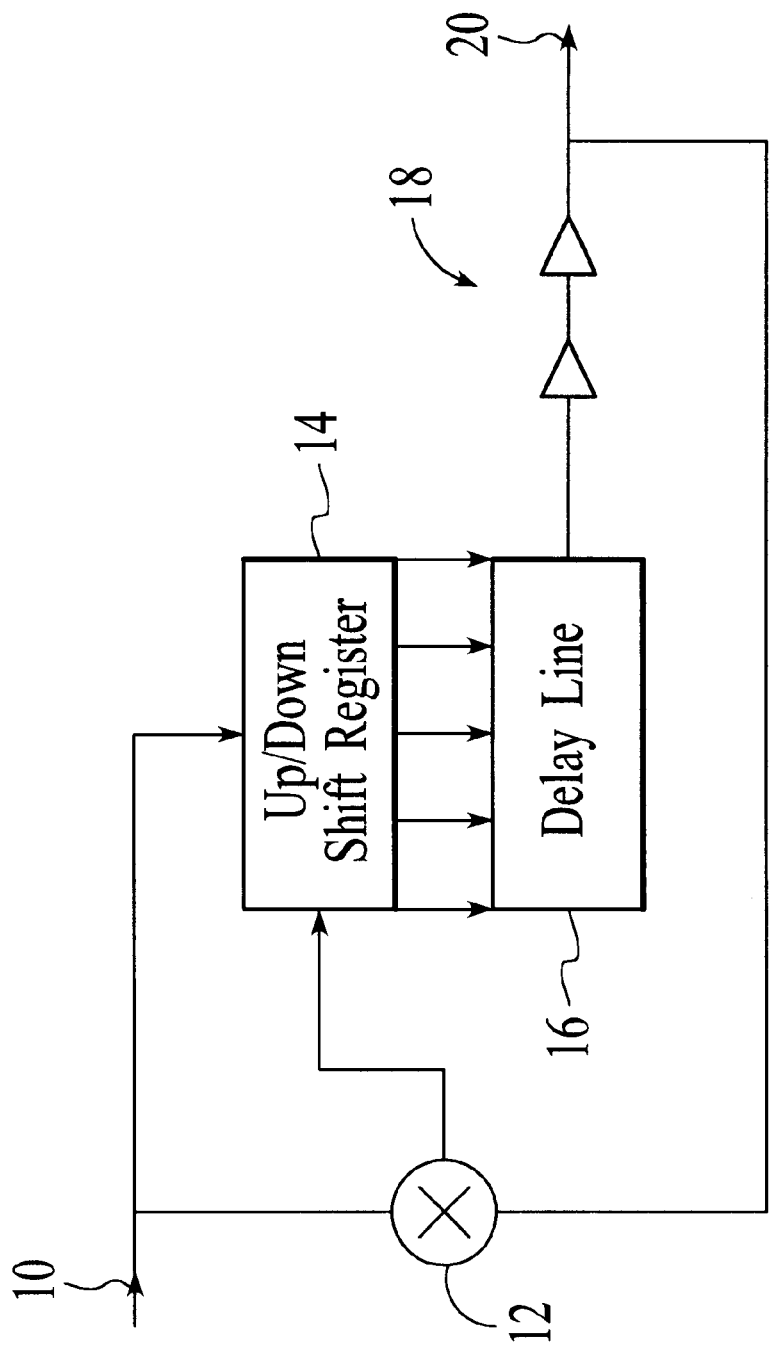
FIG. 1 shows a conventional digital delay locked loop configuration.
Figure 2:
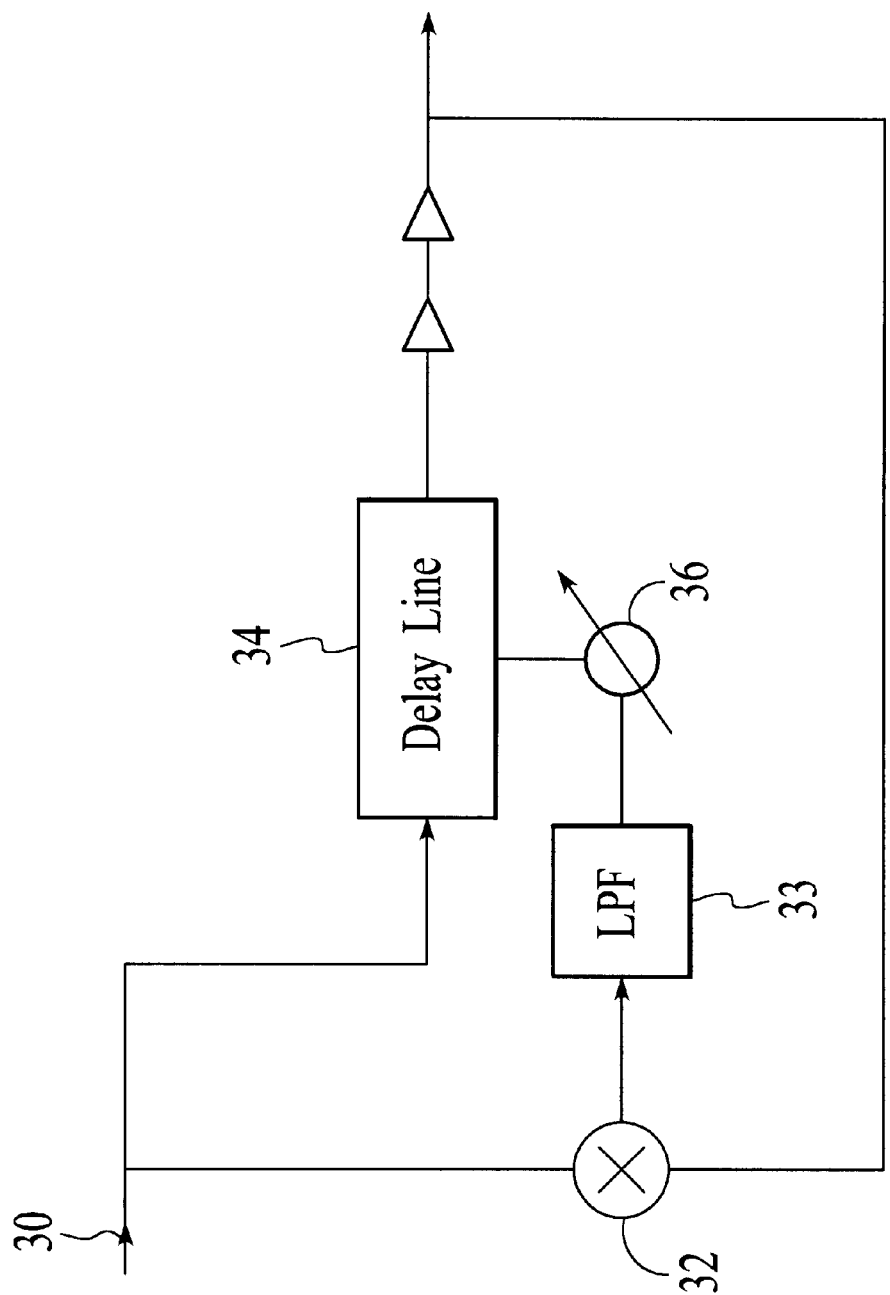
FIG. 2 shows a conventional analog delay locked loop configuration.
Figure 3:
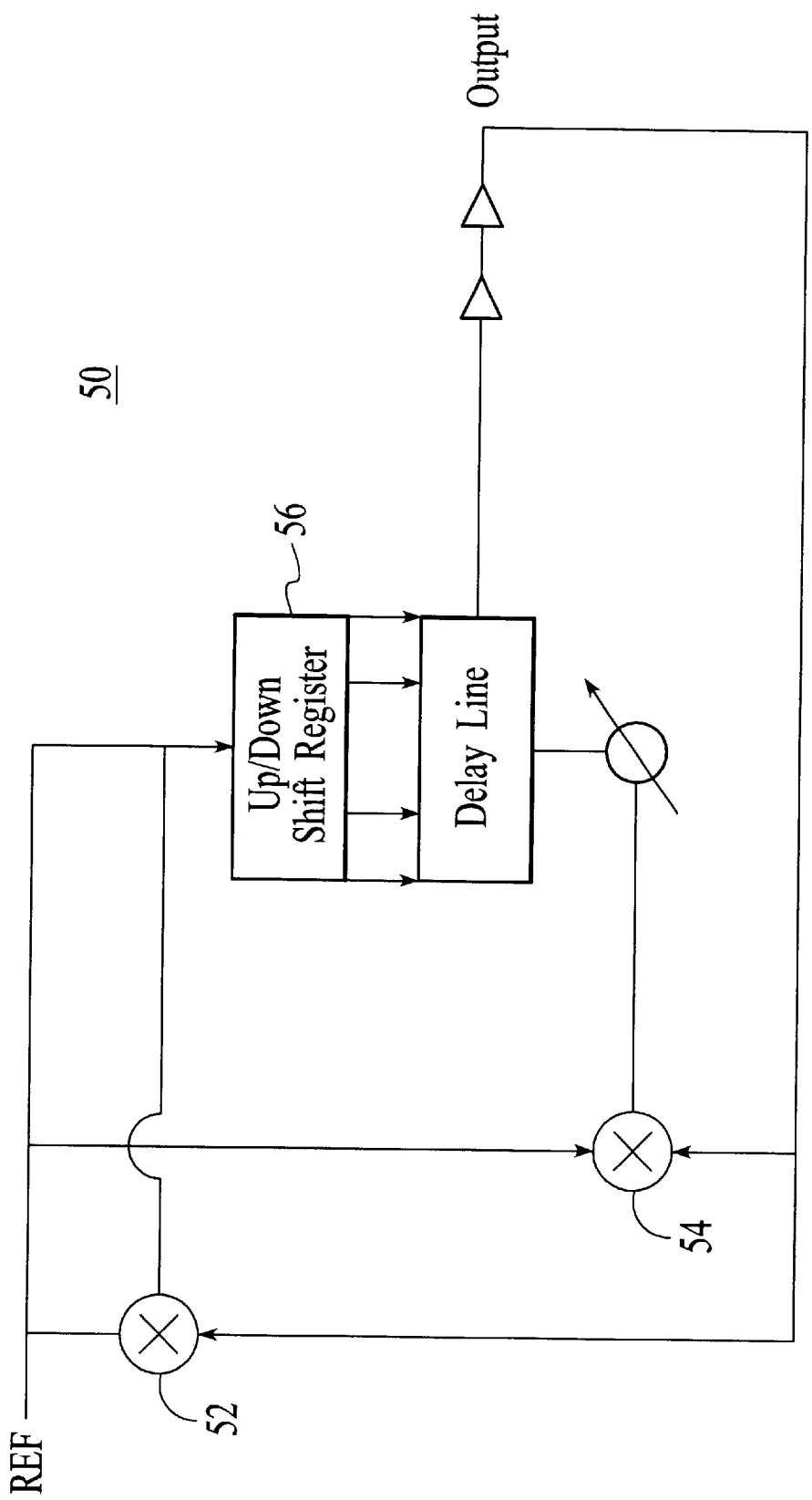
FIG. 3 shows a conventional hybrid delay locked loop configuration.
Figure 4:
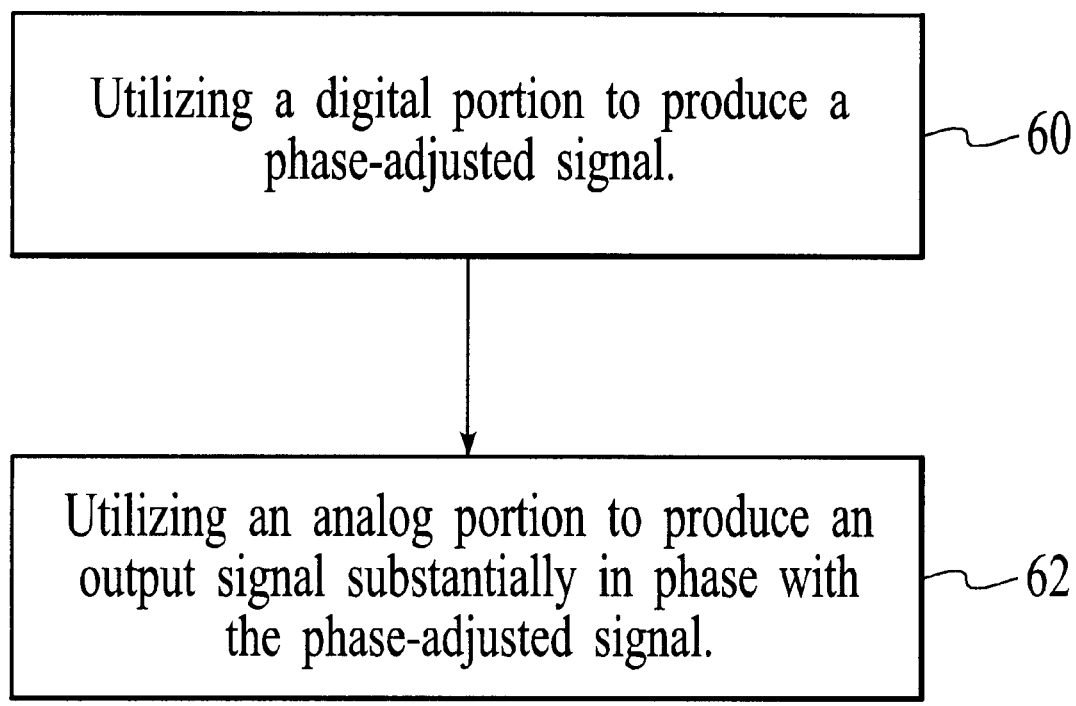
FIG. 4 is a high-level flowchart of a method in accordance with the present invention.

To more particularly describe the method and system in accordance with the present invention, FIG. 4 is a high-level flowchart of a method in accordance with the present invention. First, a digital portion of an electrical circuit is utilized to produce a phase-adjusted signal, via step 60. Next, an analog portion of the electrical circuit is utilized to produce an output signal in substantially the same phase as the phase-adjusted signal, via step 62. Through the use of the method and system in accordance with the present invention, the large shift register of conventional hybrid DLLs is no longer necessary and high speed DLLs will be capable of providing high resolution deskewed clocks in a shorter amount of time. The use of the present invention also facilitates the coverage of a wider range of clock frequencies.

Figure 5:
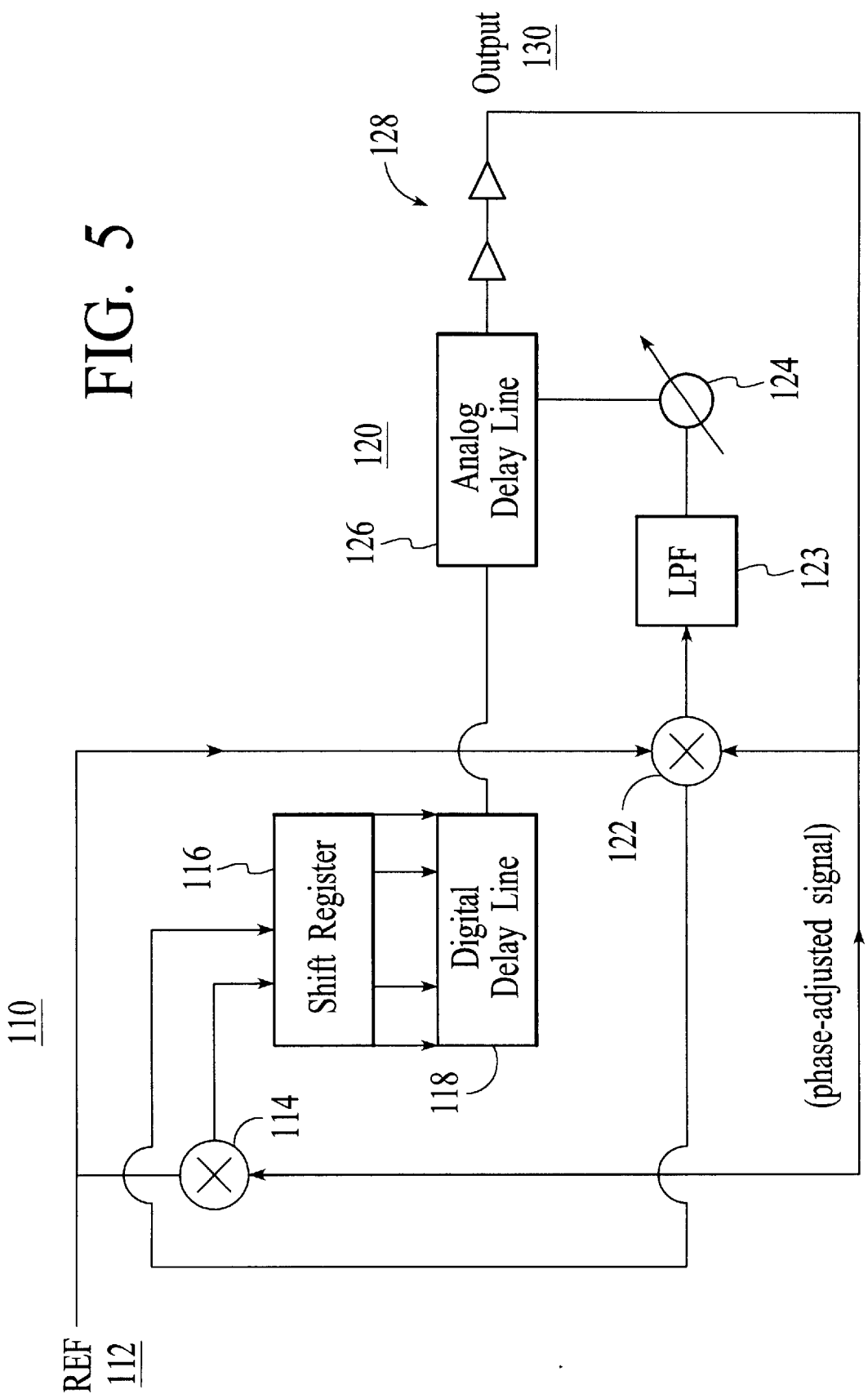
FIG. 5 depicts the architecture of the preferred embodiment of a hybrid DLL in accordance with the present invention.

A method and system in accordance with the present invention is disclosed in the context of a preferred embodiment. The preferred embodiment of the present invention is a hybrid digital/analog DLL. FIG. 5 depicts the architecture of the preferred embodiment of a hybrid DLL 100 in accordance with the present invention. As the nomenclature implies, the hybrid DLL comprises a digital portion 110 and an analog portion 120. The digital portion 110 comprises a first phase detector 114, a shift register 116, and a digital delay line 118. The analog portion 120 preferably comprises a second phase detector 122, a current controller 124, an analog delay line 126, and a buffer tree 128. The current controller 124 may also contain a charge pump and a low pass filter 123.

The hybrid DLL in accordance with the present invention is able to implement the quick lock-in aspect of a digital DLL, as well as the high resolution of an analog DLL. Accordingly, the present invention addresses the need to achieve a high resolution lock-in in the shortest time, irrespective of whether the phase of a local output signal is leading or lagging relative to the phase of an input reference signal 112.

Figure 6:
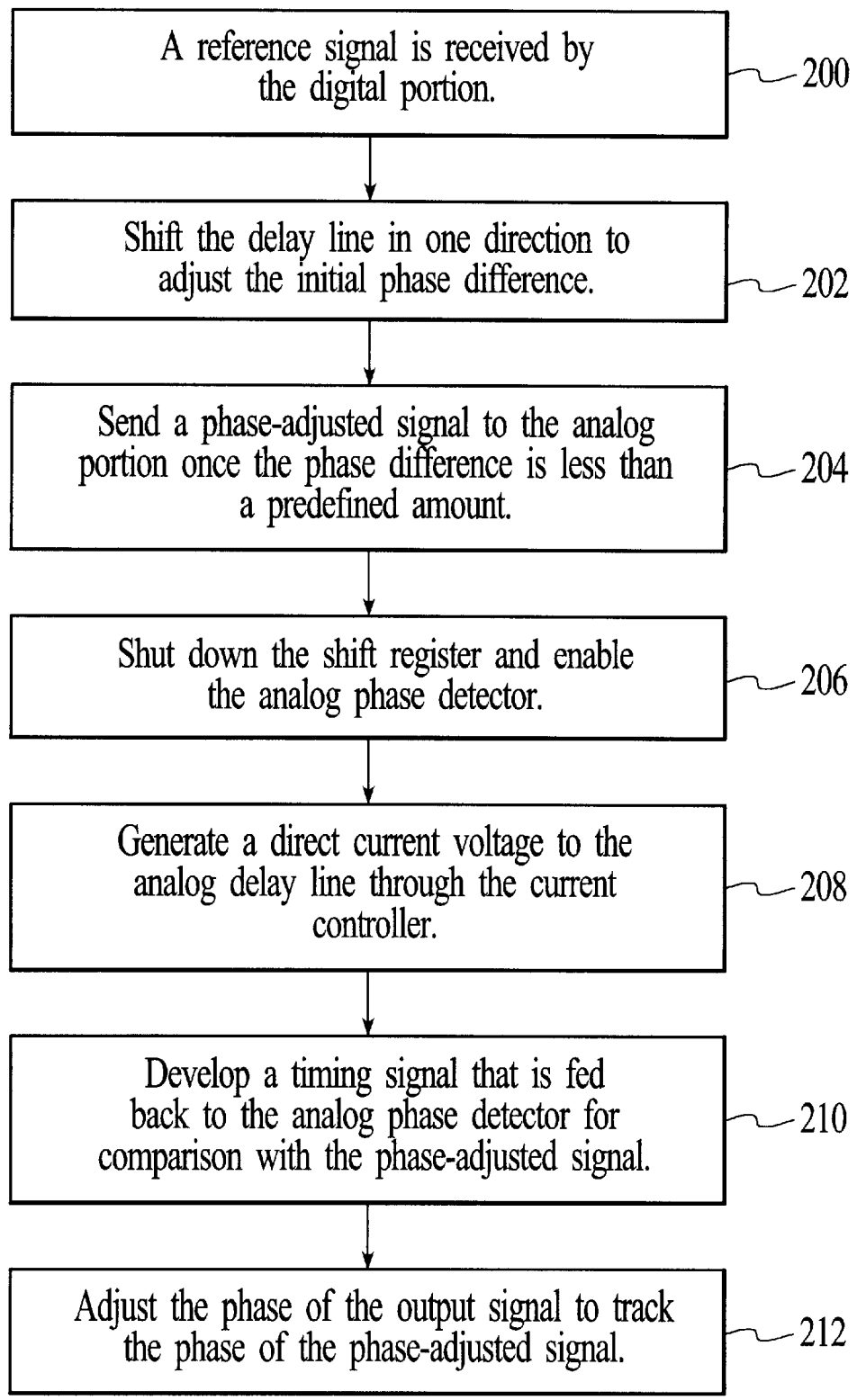
FIG. 6 is a detailed flowchart of the operation of a method in accordance with the present invention.
Figure 7:
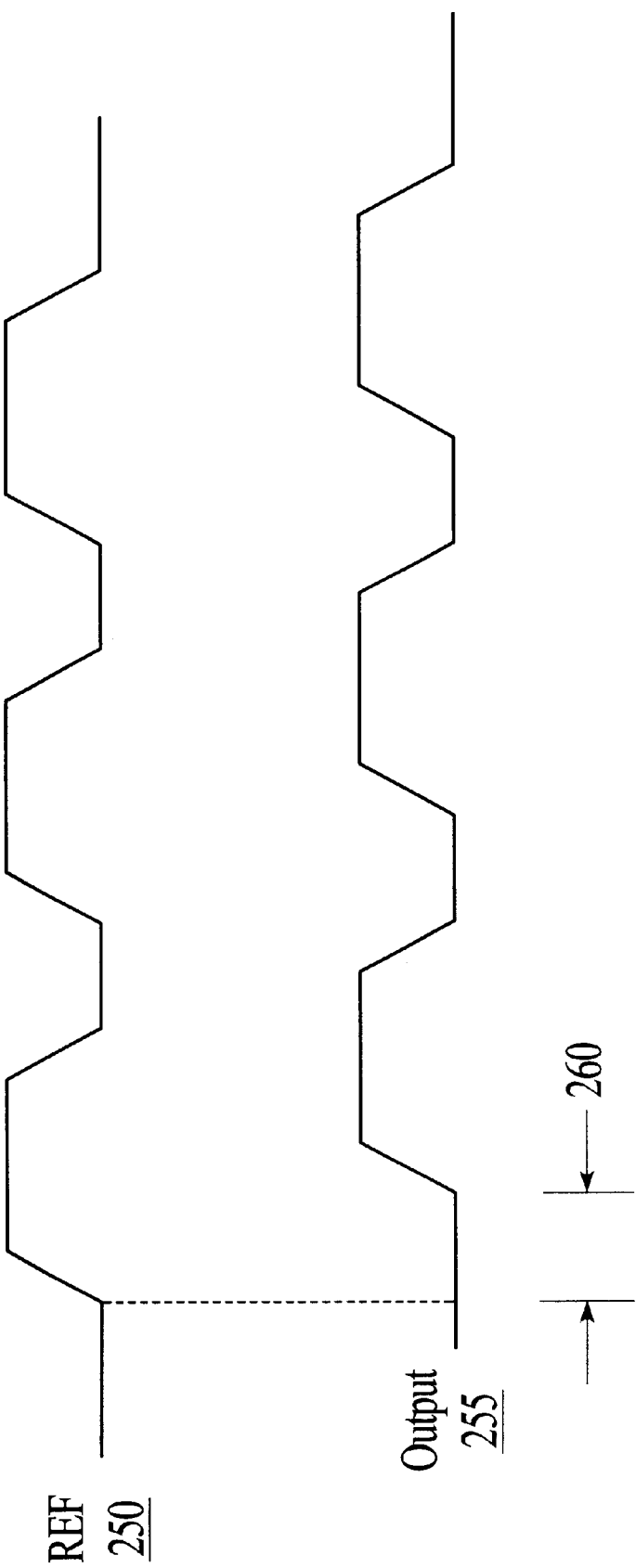
FIG. 7 depicts the timing of a reference signal and an output signal.

To describe the operation of the method in accordance with the present invention, please refer now to the flowchart of FIG. 6 in conjunction with FIG. 5. First, a reference signal 112 is received by the digital portion 110, via step 200. Next, the shift register 116 shifts the delay line 118 in one direction to adjust the initial phase difference between the reference signal 112 and the output signal 130, via step 202. By shifting the delay line 118 in only one direction, the need for a large shift register is eliminated. This decreases the layout size, which in turn increases system efficiency. Next, the digital phase detector 114 tracks the phase difference between the reference signal 112 and the output signal 130 and sends a phase-adjusted signal to the analog phase detector 122 once the phase difference is less than a predefined amount, via step 204. FIG. 7 depicts the timing of a reference signal 250 and an output signal 255 at the point where the phase difference is a predefined amount 260.

Referring back to FIGS. 5–6, next, the digital phase detector 114 shuts down the shift register 116 and enables an analog phase detector 122, via step 206. By shutting down the shift register 116 prior to lock-in and enabling the analog portion, the phase jitter of conventional hybrid DLLs is eliminated. Once enabled, the analog phase detector 122 generates a direct current voltage to the analog delay line 126 through a current controller 124, via step 208. The analog delay line 126 then develops a timing signal that is fed back to the analog phase detector 122 for comparison with the phase-adjusted signal, via step 210. Finally, the phase of the output signal 130 is adjusted to track the phase of the reference signal 112, via step 212.

Through the use of the method and system in accordance with the present invention, the large bi-direction shift register of conventional hybrid DLLs is no longer necessary and high speed DLLs will be capable of providing high resolution deskewed clocks in a shorter amount of time. The use of the present invention also facilitates the coverage of a wider range of clock frequencies.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A delay lock loop (DLL) circuit comprising:

an input port for receiving a signal;

a digital portion coupled to the input port, the digital portion including a first phase detector; a shift register coupled to the first phase detector, the shift register having the capacity to shift only in one direction; and a first delay line coupled to the shift register, wherein the digital portion produces a phase-adjusted signal; and an analog portion coupled to the first delay line, wherein the analog portion includes a second delay line, the analog portion is coupled to an output port, and produces an output signal in substantially the same phase as the phase-adjusted signal.

2. The DLL circuit of claim 1 wherein the analog portion further comprises:

a second phase detector coupled to the shift register;

a current controller coupled to the second phase detector; and the second delay line coupled to the current controller.

3. The DLL circuit of claim 1 wherein the only one direction is an up direction.

4. A method for synchronizing a reference signal and an output signal, the output signal produced by an electrical circuit, the electrical circuit comprising an analog portion and a digital portion, the method comprising the steps of:

(a) utilizing the digital portion to provide a phase-adjusted signal, wherein the digital portion includes a first delay line; and (b) utilizing the analog portion to provide an output signal in substantially the same phase as the phase-adjusted signal, wherein the analog portion includes a second delay line.

5. The method of claim 4 wherein the phase-adjusted signal is provided by shifting the first delay line in only one direction.

6. The method of claim 5 wherein the only one direction is an up direction.

7. The method of claim 6 wherein the utilizing step (a) further comprises the steps of:

(a1) receiving the reference signal;

(a2) employing a shift register to adjust an initial phase difference between the reference signal and the output signal by shifting the first delay line in only one direction;

(a3) utilizing a first phase detector to track the phase difference between the reference signal and the output signal;

(a4) shutting down the shift register once the phase difference is less than a predefined amount; and (a5) enabling a second phase detector by sending the phase-adjusted signal to the second phase detector once the phase difference is less than a predefined amount.

8. The method of claim 7 wherein the utilizing step (b) further comprises the steps of:

(b1) receiving the phase adjusted signal from the first phase detector;

(b2) utilizing the second phase detector to generate a current voltage to the second delay line; and (b3) adjusting the output signal to track the phase of the phase-adjusted signal.

9. The method of claim 8 wherein the first phase detector is a digital phase detector.

10. The method of claim 9 wherein the second phase detector is an analog phase detector.

11. A system for synchronizing a reference signal and an output signal, the output signal produced by an electrical circuit, the electrical circuit comprising an analog portion and a digital portion, the system comprising:

means for utilizing the digital portion to provide a phase-adjusted signal, wherein the digital portion includes a first delay line; and means for utilizing the analog portion, coupled to the means for utilizing the digital portion, to provide an output signal in substantially the same phase as the phase-adjusted signal, wherein the analog portion includes a second delay line.

12. The system of claim 11 wherein the phase-adjusted signal is provided by shifting the first delay line in only one direction.

13. The system of claim 12 wherein the only one direction is an up direction.

14. The system of claim 13 wherein the means for utilizing the digital portion further comprises:

means for receiving the reference signal;

means for employing a shift register to adjust an initial phase difference between the reference signal and the output signal by shifting the first delay line in only one direction;

means for utilizing a first phase detector to track the phase difference between the reference signal and the output signal;

means for shutting down the shift register once the phase difference is less than a predefined amount; and means for enabling a second phase detector by sending the phase-adjusted signal to the second phase detector once the phase difference is less than a predefined amount.

15. The system of claim 14 wherein the means for utilizing the analog portion comprises:

means for receiving the phase adjusted signal from the first phase detector;

means for utilizing the second phase detector to generate a current voltage to the second delay line; and means for adjusting the output signal to track the phase of the phase-adjusted signal.

16. The system of claim 15 wherein the first phase detector is a digital phase detector.

17. The system of claim 16 wherein the second phase detector is an analog phase detector.

* * * * *